(12) United States Patent
Riccobene

(10) Patent No.: US 6,525,378 B1
(45) Date of Patent: Feb. 25, 2003

(54) RAISED S/D REGION FOR OPTIMAL SILICIDATION TO CONTROL FLOATING BODY EFFECTS IN SOI DEVICES

(75) Inventor: Concetta E. Riccobene, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/880,550

(22) Filed: Jun. 13, 2001

(51) Int. Cl.[7] .......................... H01L 27/01; H01L 27/12; H01L 31/0392
(52) U.S. Cl. ........................ 257/347; 257/377; 257/382; 257/384; 257/386
(58) Field of Search ................................ 257/347, 377, 257/382, 384, 386, 408, 412; 438/149, 479, 517, 300

(56) References Cited

U.S. PATENT DOCUMENTS

| | | | |
|---|---|---|---|
| 5,352,631 A | 10/1994 | Sitaram et al. | |
| 5,659,194 A | * 8/1997 | Iwamatsu et al. | 257/377 |
| 6,051,473 A | 4/2000 | Ishida et al. | |

* cited by examiner

Primary Examiner—Tom Thomas
Assistant Examiner—Thien F Tran
(74) Attorney, Agent, or Firm—Renner, Otto, Boisselle & Sklar, LLP

(57) ABSTRACT

A semiconductor device and a method of forming same are disclosed. The device includes an SOI wafer including a semiconductor layer, a substrate and a buried insulator layer therebetween. The semiconductor layer includes a source region, a drain region, and a body region disposed between the source and drain regions. At least one of the source and drain regions includes an epitaxially raised region. A gate is on the semiconductor layer, the gate being operatively arranged with the source, drain, and body regions to form a transistor. The at least one of the source and drain regions including the epitaxially raised region includes a silicide region spaced apart from the body region by about 200 to about 1000 Angstroms.

28 Claims, 5 Drawing Sheets

Depth below top surface of source and drain regions (Angstroms)

RAISED S/D REGION FOR OPTIMAL SILICIDATION TO CONTROL FLOATING BODY EFFECTS IN SOI DEVICES

TECHNICAL FIELD

The invention relates generally to semiconductor-on-insulator devices and methods for forming the same. The invention relates particularly to semiconductor-on-insulator devices and methods for forming which avoid or reduce floating body effects and reduce contact resistance.

BACKGROUND ART

Silicon on insulator (SOI) materials offer potential advantages over bulk materials for the fabrication of high performance integrated circuits. Dielectric isolation and reduction of parasitic capacitance improve circuit performance, and eliminate latch-up in CMOS circuits. In addition, circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). These floating body effects may result in undesirable performance in SOI devices.

SUMMARY OF THE INVENTION

According to one aspect of the invention, the invention is a semiconductor device. The device includes an SOI wafer including a semiconductor layer, a substrate and a buried insulator layer therebetween; the semiconductor layer including a source region, a drain region, and a body region disposed between the source and drain regions, at least one of the source and drain regions including an epitaxially raised region; and, a gate on the semiconductor layer, the gate being operatively arranged with the source, drain, and body regions to form a transistor; wherein the at least one of the source and drain regions including the epitaxially raised region includes a silicide region spaced apart from the body region by about 200 to about 1000 Angstroms (Å).

According to another aspect of the invention, the invention is a method of forming a semiconductor device. The method includes the steps of forming an SOI wafer having a semiconductor layer, a substrate and a buried insulator layer therebetween, wherein the semiconductor layer includes a source region, a drain region, and a body region disposed between the source and drain regions, at least one of the source and drain regions including an epitaxially raised region; forming a gate on the semiconductor layer before, during, or after the forming of the source, drain, and body regions; and, forming a silicide region in the epitaxially raised source or drain region such that the silicide region is spaced apart from the body region by about 200 to about 1000 Angstroms (Å).

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
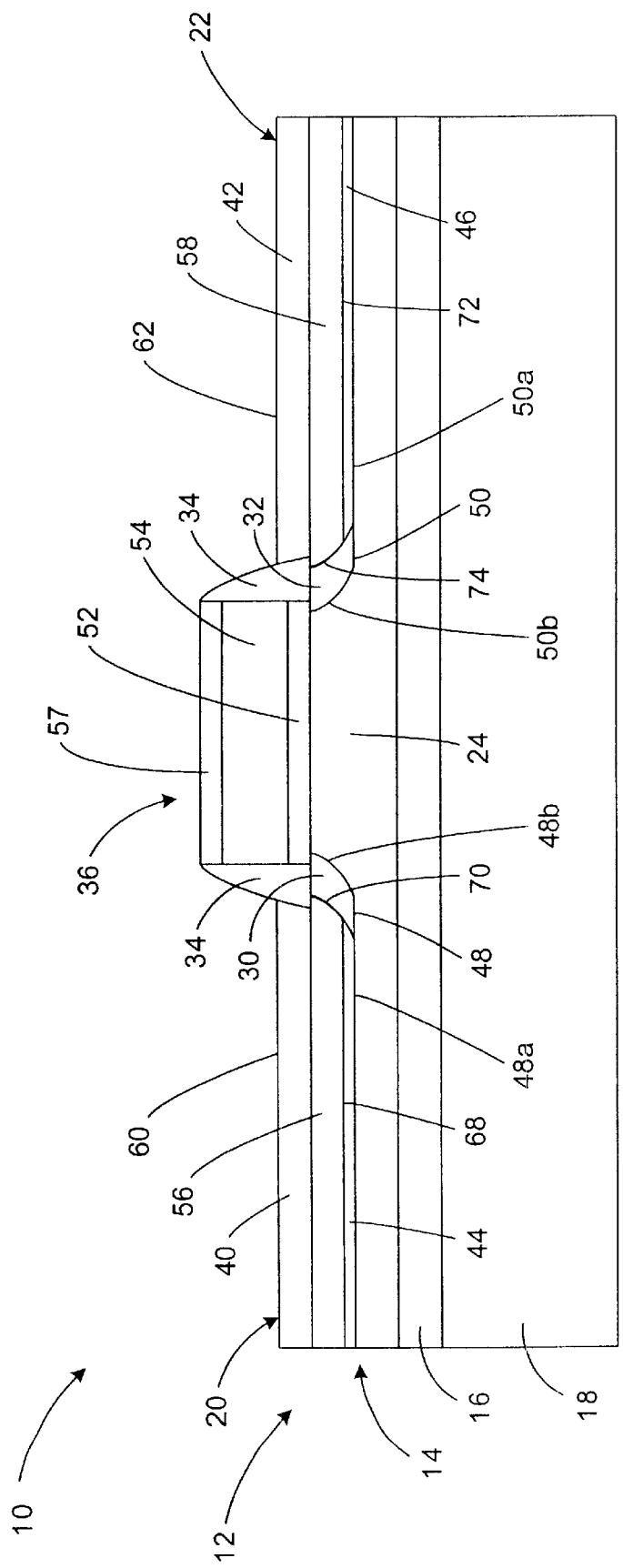
FIG. 1 is a cross-sectional view of a semiconductor-on-insulator field effect transistor in accordance with the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor device 10 according to the present invention is shown. The semiconductor device 10 includes a silicon-on-insulator (SOI) wafer 12, the SOI wafer 12 including an active layer 14, also referred to as a semiconductor layer 14, a buried insulator layer 16, and a semiconductor substrate 18. In one embodiment, the wafer 12 has a silicon semiconductor layer 14 and semiconductor substrate 18, and a silicon dioxide ($SiO_2$) buried insulator layer 16.

The semiconductor layer 14 has a MOSFET formed therein which is includes a source region 20, a drain region 22, and a body region 24. The illustrated body region 24 is disposed between and extends laterally below the source region 20 and the drain region 22, although it will be appreciated that the source region 20 and drain region 22 may extend vertically to the buried insulator layer 16 such that the body region 24 does not laterally extend under the source region 20 or drain region 22. The source region 20 and the drain region 22 have opposite doping from the body region 24. For example, the source and drain regions 20, 22 may be N-doped, with the body region 24 being P-doped. Alternatively, the source and drain regions 20, 22 may have P-doping, with the body region 24 having N-doping.

The source and drain regions 20 and 22 include respective extensions 30 and 32 which extend underneath sidewall spacers 34 adjacent a gate stack 36 disposed atop the wafer 12. The extensions 32 extend partially underneath the gate stack 36. The source and drain regions 20 and 22 also include respective raised regions 40 and 42 which are disposed on opposite sides of the gate stack 36 and are deep doped to about the same depth as the extensions 30 and 32 to form deep doped regions 44 and 46. As is described in greater detail below, alternatively in situ doping can be carried out to form the deep doped regions 44 and 46. In the illustrated embodiment, the deep doped source and drain regions 44 and 46 extend partially underneath the spacers 34 about the same distance that the extensions 30 and 32 extend underneath the gate stack 36.

The source region 20 adjacent the body region 24 forms a source/body junction 48; more particularly, the bottom of the source region 20 interfaces the body region 24 at reference numeral 48a and at the channel at reference numeral 48b, which together form the source/body junction 48. Similarly, the drain region 22 adjacent the body region 24 forms a drain/body junction 50; more particularly, the bottom of the drain region 22 interfaces the body region 24 at reference numeral 50a and at the channel at reference numeral 50b, which together form the drain/body junction 50.

A gate dielectric 52 is disposed between a polysilicon gate portion 54 and the wafer 12. The gate dielectric 52 may be formed of a conventional material such as silicon dioxide, silicon oxynitride, or silicon nitride ($Si_3N_4$).

The source and drain regions 20 and 22 of the semiconductor device 10 also include respective source and drain silicide regions 56 and 58 on opposite sides of the gate 36, and a gate silicide region 57 in the gate 36. The silicide regions 56 and 58 extend vertically downward in the raised regions 40 and 42 and partially in the remainder of the deep doped regions 44 and 46. The suicide regions 56 and 58 also extend under the spacers 34 about the same distance as the deep doped regions 44 and 46. In the illustrated embodiment, the source and drain suicide regions 56 and 58 are substantially symmetric about the gate 36, although it will be appreciated that the silicide regions 56 and 58 may be asymmetrical relative to the gate 36. The silicide regions 56 and 58 have respective exposed surfaces 60 and 62 for external electrical connection. The source silicide region 56 interfaces the non-silicided portion of the source region 20 at interface regions 68 and 70. Similarly, the drain silicide region 58 interfaces the non-silicided portion of the drain region 22 at interface regions 72 and 74.

According to the invention, the proximity of the silicide regions 56 and 58 and, more particularly, the respective interface regions 68, 70, 72 and 74 thereof, to the respective source/body and drain/body junctions 48 and 50 makes the junctions 48 and 58 "leaky", thus providing a path for carriers to reach the channel of the device 10. This improves the diode effect in the device 10 and reduces the aforementioned floating body effects. Also, according to the invention, the source and drain regions 20 and 22 include raised portions 40 and 42 to accommodate thicker silicide regions 56 and 58. This enables formation of the silicide regions 56 and 58 into the higher doping concentration region of the source/drain doping distribution which, in turn, substantially reduces contact resistance between the silicide regions 56 and 58 and the source/body and drain/body junctions 48 and 58 without losing the advantage of the reduced floating body effects.

Figure 2:
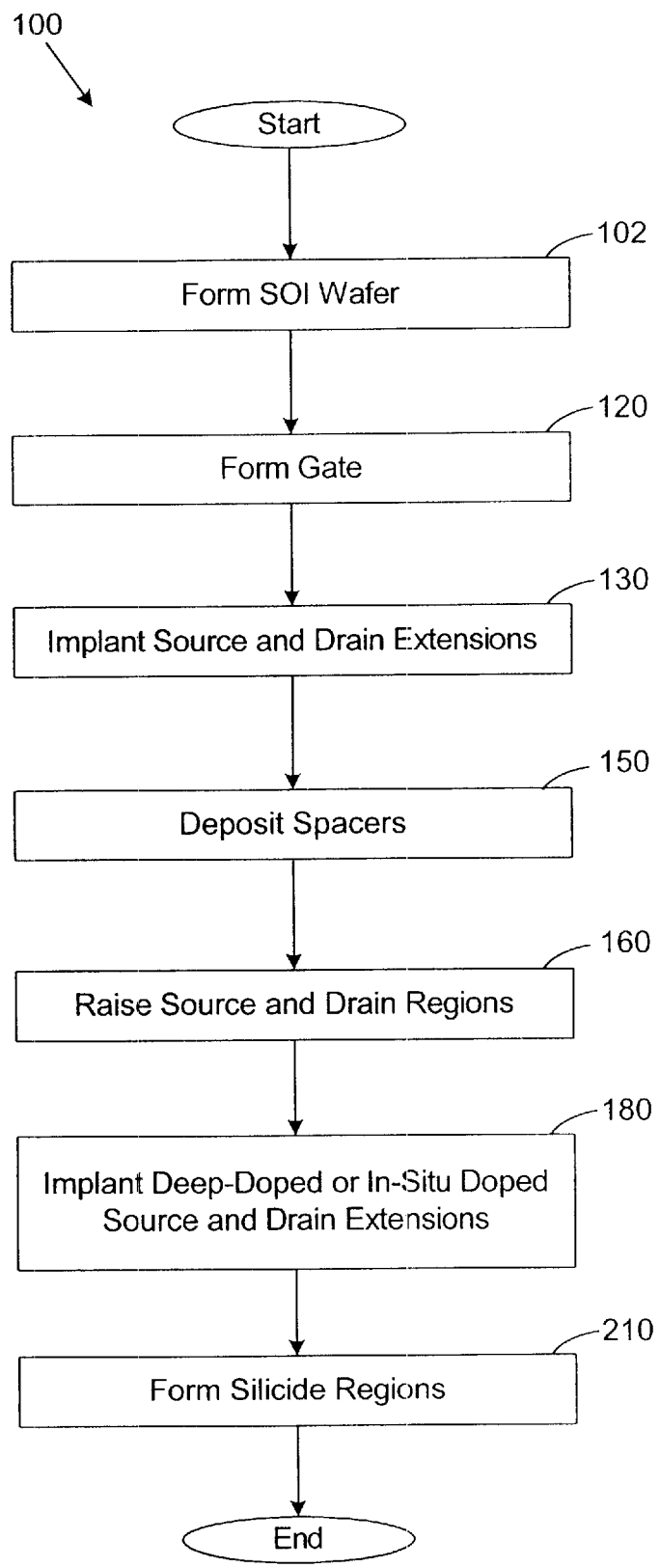
FIG. 2 is a flow chart of a method of making the FIG. 1 semiconductor device.

FIG. 2 is a flow chart of a method 100 for forming the semiconductor device 10 shown in FIG. 1 and described above.

Figure 3:
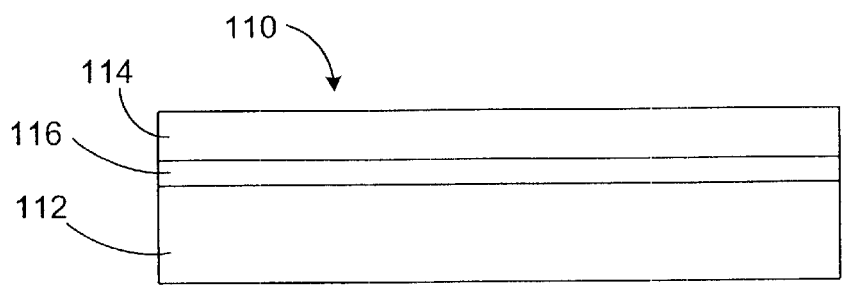
FIGS. 3–10 are cross-sectional views of intermediate structures which illustrate a method of forming the semiconductor device of FIG. 1, in accordance with the present invention.

Initially at step 102, a silicon-on-insulator (SOI) wafer 110 (FIG. 3) is formed. The SOI wafer 110 includes a bulk semiconductor region, or substrate 112, and an active layer, also referred to as a surface semiconductor. layer 114, with a buried insulator layer 116 therebetween. The semiconductor layer 114 may be suitably doped for the formation of a P-channel or an N-channel device. The wafer 110 may be formed using techniques known in the art such as wafer bonding or SIMOX.

Figure 4:
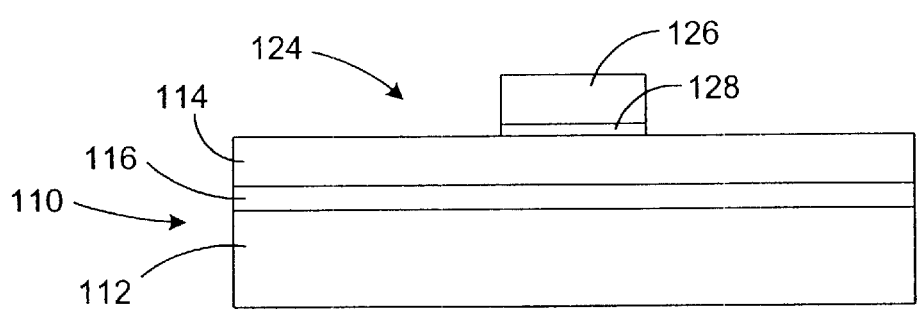

Thereafter, in step 120, illustrated in FIG. 4, a gate stack 122 including a gate 126 (also referred to herein as a gate electrode) and a gate dielectric 128 are formed on the SOI wafer 110 as part of a semiconductor device 124. The gate 126 and the gate dielectric 128 may be formed on the wafer 110 by suitable, well-known methods. For example, a layer of dielectric material, for example $SiO_2$ or $Si_3N_4$, may be deposited on and/or grown on the semiconductor layer 114. The layer of dielectric material may have an exemplary thickness of between about 20 to 200 Angstroms (Å), although it will be appreciated that the layer may have a different thickness. Thereafter a layer of gate electrode material may be deposited on the dielectric material. An exemplary gate electrode material is polysilicon, which may be deposited, for example, using low pressure chemical vapor deposition (LPCVD) processing techniques, at a temperature from about 500 to 650° C., to a thickness of between about 750 and about 2000 Angstroms (Å). As is described in greater detail below, if the gate 126 is later to be silicidized, the thickness of the gate 126 may need to be increased so as to prevent the silicidization from reaching the gate dielectric 128.

The dielectric and electrode materials may be selectively removed, for example, by well-known photolithographic and selective etching methods, to form the gate electrode 126 in a desired location. An example of a suitable etching method is reactive ion etching (RIE), using $Cl_2$ as an etchant. It will be appreciated that a wide variety of other suitable methods and structures (e.g., multi-layers) for gate formation may be employed in this step.

Figure 5:
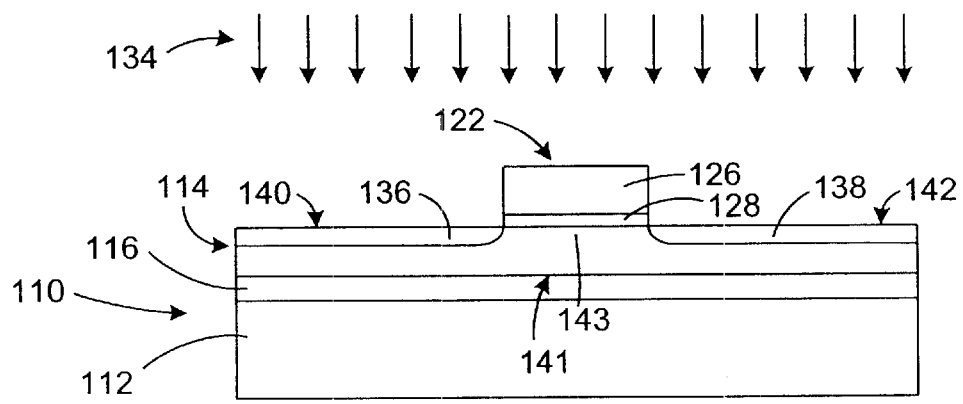

In step 130, illustrated in FIG. 5, shallow doping implantation 134 is employed to create respective source and drain extensions 136 and 138 in the semiconductor layer 114. The extensions 136 and 138 form part of respective source and drain regions 140 and 142, which are on opposite sides of and above a body region 141, as is further described below. Exemplary ions for the shallow doping implantation 134 are phosphorous and arsenic, an exemplary energy range for the implantation 134 is about 250 eV to about 20 KeV (for arsenic), and an exemplary dosage range for the implantation 134 is between about $1\times10^{14}$ and about $4\times10^{15}$ atoms/$cm^2$. An exemplary doping concentration range of the shallow doping implantation 134 is about $1\times10^{20}$ to about $1\times10^{22}$ atoms/$cm^3$. The depth of the extensions 136 and 138 is between about 200 to about 400 Angstroms (Å). The type of doping for the extensions 136 and 138 is the opposite of the conductivity type of the remainder of the semiconductor layer 114. Thus if the semiconductor layer 114 has N-type doping, the extensions 136 and 138 will be P-doped. Conversely, if the semiconductor layer 114 has P-type doping, the extensions 136 and 138 will have N-type doping.

Also, it will be appreciated that the gate 126 acts as a self-aligned mask to prevent doping in the semiconductor layer 114 which is beneath the gate 126; this region also being referred to herein as a channel subregion 143, the channel subregion forming part of the body region 141. It will also be appreciated that there may be some overlap between the gate 126 and the extensions 136 and 138, as is conventional. It will further be appreciated that, if desired, a separate doping mask may be used in place of the gate 126 for this step, formation of the gate thereby being delayed until after such doping mask is removed.

Figure 6:
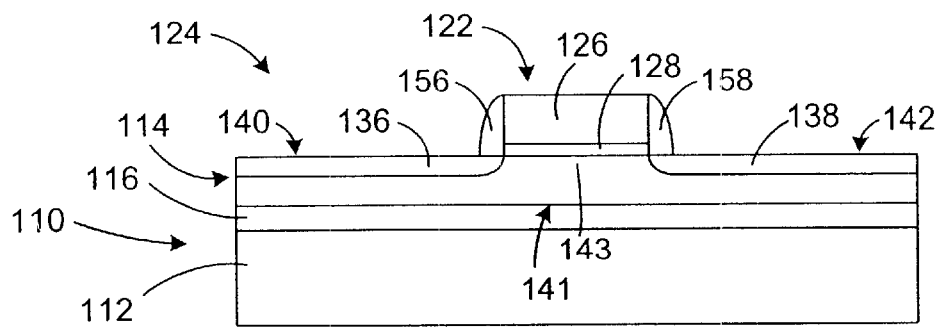

Referring to FIG. 6, in step 150 side wall spacers 156 and 158 are formed adjacent the gate 126. The spacers 156 and 158 are formed using conventional techniques and are made from a material such as silicon oxide ($SiO_2$) or a nitride (e.g., $Si_3Na$). The width of the spacers is about 500 Angstroms (Å), although it will be appreciated that other thicknesses may be suitable, for example, in the range of about 300 Angstroms (Å) to about 1300 Angstroms (Å).

Figure 7:
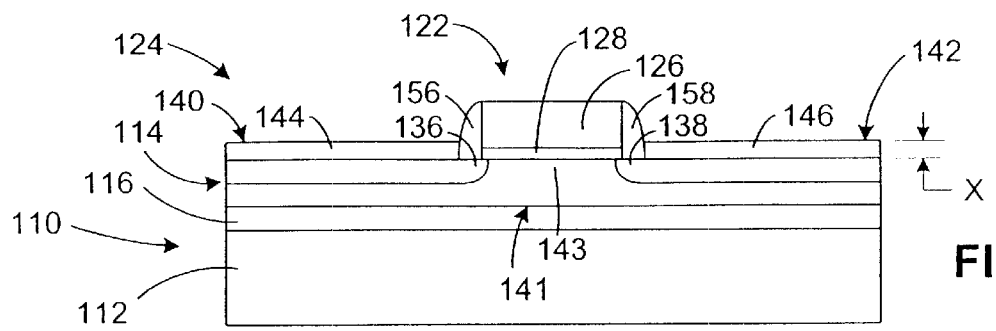

In step 160, illustrated in FIG. 7, selective epitaxial regrowth is used to vertically elevate the source and drain regions 140 and 142 and thus form raised source and drain regions 144 and 146 in the semiconductor layer 114. The thickness of the raised source and drain regions 144 and 146 ("X" in FIG. 7) is between about 300 and about 600 Angstroms (Å). As is desired, the grown regions 140 and 142 duplicate the crystalline orientation of the remainder of the semiconductor layer 114.

Figure 8:
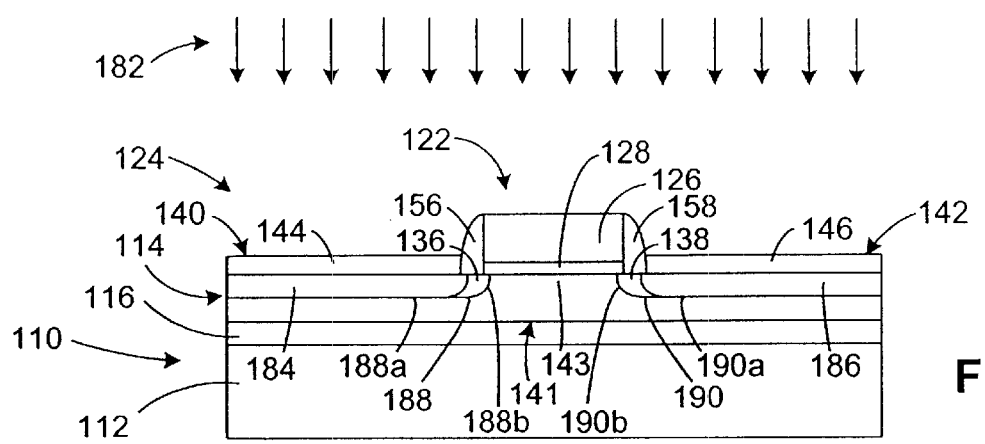

In step 180, illustrated in FIG. 8, source/drain deep implantation 182 is used to form deep-doped source and drain regions 184 and 186 after formation of the epitaxially raised source and drain regions 144 and 146. In other embodiments, one or each of the raised source and drain regions 144 and 146 can also be doped using in-situ deposition techniques, as will be described below. Exemplary ions for the deep implantation 182 are boron or antimony to achieve P-type doping and phosphorous or arsenic to achieve N-type doping. For arsenic, an exemplary energy range for the deep implantation 182 is about 20 KeV to about 60 KeV, and an exemplary dosage range for the deep implantation 182 is between about $2\times10^{15}$ to about $5\times10^5$ atoms/cm$^2$. An exemplary doping concentration range of the deep implantation 182 is about $5\times10^{20}$ to about $5\times10^{15}$ atoms/cm$^3$. In the illustrated embodiment, the deep doped regions 184 and 186 extend vertically downward in the raised regions 144 and 146 to about the same depth as that of the respective extensions 136 and 138. An exemplary thickness of the deep doped regions 184 and 186 from the top of the epitaxial raised regions 144 and 146 to the bottom of the deep doped regions 184 and 186 is about 650 to about 1500 Angstroms (Å) (for example, for a semiconductor layer having a depth of about 1000 Angstroms (Å)). It will be appreciated that the deep doped regions 184 and 186 may extend vertically downward to the buried insulator layer 116. Also, it will be appreciated that the gate 126 and the spacers 156 and 158 act as a self aligned mask, blocking implantation in the part of the body region 141 of the semiconductor layer 114 which is beneath the gate 126 and spacers 156 and 158.

The source region 140 of the semiconductor layer 114 is thereby formed, the source region 140 including the source extension 136 and the deep doped region 184. Similarly, the drain region 142 is formed which includes the drain extension 138 and the deep doped region 186. The body region 141 is defined as the region of the semiconductor layer 114 between and extending laterally below the source region 140 and the drain region 142. As was noted above, it will be appreciated that the source and drain regions 140 and 142 may extend vertically to the buried insulator layer 116. In such case, the body region 141 does not laterally extend under the source and drain regions 140 and 142. The body region 141 includes the channel subregion 143.

The source region 140 interfaces with the body region 141 to form a source/body junction 188 (also referred to herein as an S/D junction); in particular, the bottom of the source region 140 interfaces the body region 141 at reference numeral 188*a* and at the channel subregion 143 at reference numeral 188*b*, which together form the source/body junction 188. Similarly, the drain region 142 interfaces the body region 141 to form a drain/body junction 190 (also referred to as an S/D junction); in particular, the bottom of the drain region 190*a* interfaces the body region 141 at reference numeral 190*a* and at the channel subregion 143 at reference numeral 190*b*, which together form the drain/body junction 190.

Following deep implantation 182, a thermal cycle to recrystalize the silicon is conducted, the parameters of which are selected to assist in achieving close proximity of the source and drain regions 140 and 142 to the respective S/D junctions 188 and 190. An exemplary thermal cycle is low temperature anneal or rapid thermal annealing (RTA). An exemplary range of concentrations of the dopants in the source and drain regions 140 and 142 at or near the channel subregion 143 (i.e., the S/D junctions 188*b* and 190*b*) is equal to or greater than about $1\times10^{18}$ atoms/cm$^3$, and an exemplary range of concentrations of the dopants in the body region 141 at or near the channel subregion 143 is between about $5\times10^{17}$ atoms/cm$^3$ and about $5\times10^{18}$ atoms/cm$^3$.

As was alluded to above, in-situ doping may alternatively be used to form the deep doped regions 184 and 186 of the respective source and drain regions 140 and 142. In situ doping enables doping of the silicon in a controlled and uniform manner and obviates the need to diffuse the doping, in contrast to the above described ion implantation.

Figure 8A:
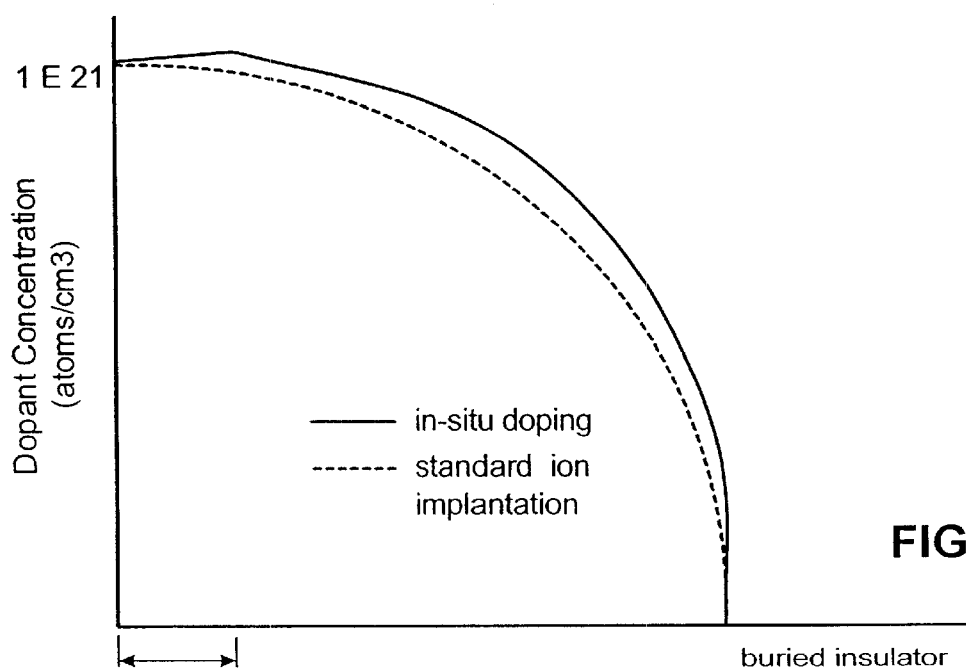
FIG. 8A is a graph of a profile distribution, illustrating concentration of dopants on the vertical axis and depth from the top surface of source and drain regions of the semiconductor device on the horizontal axis.

The dopants are implanted or in situ doped in a selected manner to provide a profile distribution such as the profile distribution 200 shown in the simplified diagram of FIG. 8A. This diagram is merely an illustration, which should not unduly limit the scope of the claims herein. One of ordinary skill in the art would recognize many other variations, modifications, and alternatives. The diagram illustrates concentration of dopants on the vertical axis, which is plotted against depth from the top surface of the source and drain regions 140 and 142.

As is shown in FIG. 8A, for in situ doping, which is represented by a solid line in FIG. 8A, the dopant concentration increases or is substantially uniform through the raised regions 144 and 146 of the respective source and drain regions 140 and 142, and then decreases through the remainder of the source and drain regions 140 and 142 (i.e., through the remainder of the deep doped regions 184 and 186). For standard ion implantation, which is represented by a dashed line in FIG. 8A and described above in accordance with reference numeral 182, the dopant concentration decreases through the raised regions 144 and 146, and decreases through the remainder of the source and drain regions 140 and 142 (i.e., through the remainder of the deep doped regions 184 and 186). As is shown, the dopant concentration for in situ doping is generally greater than the dopant concentration for standard ion implantation.

Figure 9:
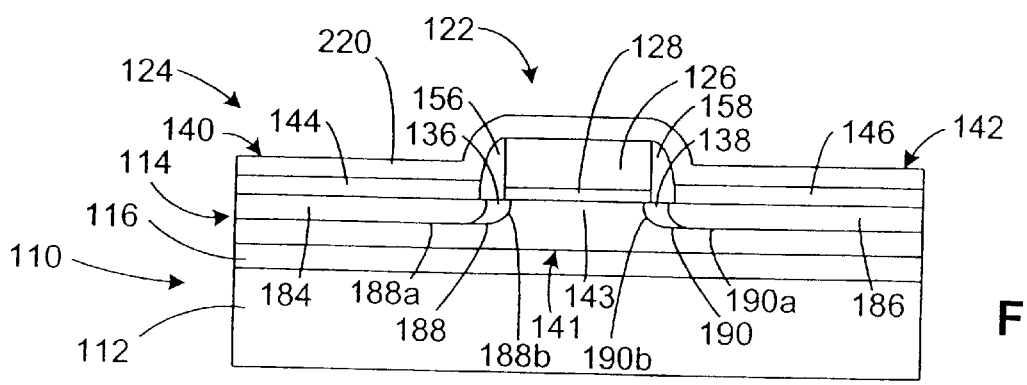

In step 210, as illustrated in FIG. 9, silicide formation is initiated by depositing a layer of metal 220 upon the gate 126, the spacers 156 and 158, and the exposed portions of the semiconductor layer 114. The metal layer 220 may be formed by sputtering, chemical vapor deposition (CVP), or evaporation. The metal of the metal layer 220 may be a metal such as titanium, cobalt, nickel, or tungsten which is suitable for reacting with the semiconductor material to form silicide.

Silicide is formed between the metal of the metal layer 220 and the exposed portions of the semiconductor layer 114 and the gate electrode 126 by a suitable method. An exemplary method is to raise the temperature of the semiconductor device 124 to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the semiconductor device 124 to a temperature between 400 and 900° C. for about 5 to 120 seconds. It will be appreciated that other temperatures and heating times may be employed.

Figure 10:
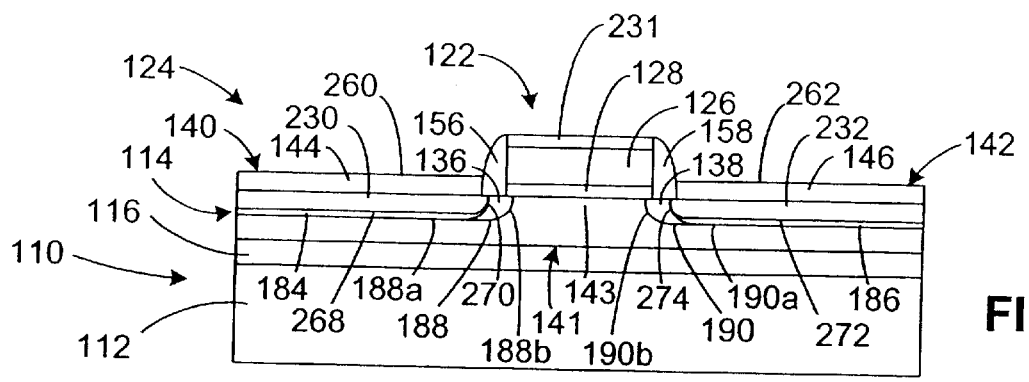

Referring to FIG. 10, the silicidation forms a source silicide region 230 and a drain silicide region 232 in the respective source and drain regions 140 and 142, and a gate silicide region 231 in the gate 126. The silicide regions 230 and 232 have respective exposed surfaces 260 and 262 for external electrical connection. As is shown in FIG. 10, the gate silicide region 231 does not reach the gate dielectric 128. This is because in step 120 the gate electrode 126 was made sufficiently thick to accommodate the silidization. As was alluded to above, the thickness of the gate 126 made in step 120 must be such as to avoid the silicidization of step 210 from reaching the gate dielectric 128.

The parameters for the silicide formation are selected to achieve silicide/non-silicide interface regions 268 and 270 for the source region 142, and silicide/non-silicide interface regions 272 and 274 for the drain region 144. As is shown in FIG. 10, the interface regions 268 and 272 face the respective S/D junctions 188a and 190a, and the interface regions 270 and 274 face the respective S/D junctions 188b and 190b. The conditions for formation of the silicide regions 230 and 232 in conjunction with the S/D junctions 188 and 190 are selected such that the bottoms 268 and 272 of the silicide regions 230 and 232 are spaced apart from the S/D junctions 188a and 190a by about 100 Angstroms (Å) to about 200 Angstroms (Å), and the channel facing portions 270 and 274 of the silicide regions 230 and 232 are spaced apart from the S/D junctions 188b and 190b by about 200 Angstroms (Å) to about 1000 Angstroms (Å). It will be appreciated that the spacing of the silicide regions 230 and 232 relative to the S/D junctions 188 and 190 will also depend on the amount of lateral diffusion of the source and drain implants.

Excess metal of the metal layer 220 is removed by conventional, well-known means, thereby leaving the semiconductor device 124 shown in FIG. 10.

The proximity of the silicide regions 230 and 232 and, more particularly, the respective interface regions 268, 270, 272 and 274 thereof, to the respective source/body and drain/body junctions 188 and 190 makes the junctions 188 and 190 "leaky", thus providing a path for carriers to reach the channel 143 of the device 110. This improves the diode effect (the ease in which the diode between the source region 140 and channel subregion 143 and between the drain region 142 and channel subregion 143 may be turned on) in the device 110 and reduces floating body effects. Also, the source and drain regions 140 and 142 include raised portions 144 and 146 to accommodate thicker silicide regions 230 and 232. This enables formation of the silicide regions 230 and 232 into the higher doping concentration region of the source/drain doping distribution, as shown for example in FIG. 8A, which, in turn, substantially reduces contact resistance between the silicide regions 230 and 232 and the source/body and drain/body junctions 188 and 190 without losing the advantage of the reduced floating body effects. As a result, overall operational performance of the device is improved.

It will be appreciated that only the source region 140 need be expitaxially raised and silicidized, as it is the source region 140 side of the device 124 at which the reduction of floating body effects is desired.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device comprising:
    an SOI wafer including a semiconductor layer, a substrate and a buried insulator layer therebetween; the semiconductor layer including a source region, a drain region, and a body region disposed between the source and drain regions, at least one of the source and drain regions including an epitaxially raised region; and,
    a gate on the semiconductor layer, the gate being operatively arranged with the source, drain, and body regions to form a transistor;
    wherein the at least one of the source and drain regions including the epitaxially raised region includes a silicide region spaced apart from the body region;
    wherein the body region laterally extends between the source region and the buried insulator layer at one end and between the drain region and buried insulator layer at another end;
    wherein the at least one of the source and drain regions including the epitaxially raised region includes a deep doped region, and the silicide region is partially in the deep doped region and is vertically spaced apart from the respective laterally extending portion of the body region by about 100 to about 200 Angstroms.

2. A semiconductor device as set forth in claim 1, wherein the at least one of the source and drain regions including the epitaxially raised region interfaces with the body region to form an S/D junction, and has a concentration of dopants at or near the S/D junction equal to or greater than about $1 \times 10^{18}$ atoms/cm$^3$.

3. A semiconductor device as set forth in claim 1, wherein the at least one of the source and drain regions including the epitaxially raised region interfaces with the body region to form an S/D junction, and the body region has a concentration of the dopants at or near S/D junction between about $5 \times 10^{17}$ atoms/cm$^3$ and about $5 \times 10^{18}$ atoms/cm$^3$.

4. A semiconductor device as set forth in claim 1, wherein both the source region and drain region respective epitaxially raised regions.

5. A semiconductor device as set forth in claim 4, wherein the epitaxially raised source and drain regions include respective source and drain silicide regions spaced apart from the body region by about 200 to about 1000 Angstroms.

6. A semiconductor device as set forth in claim 3, wherein the source suicide region and the drain silicide region are substantially symmetric with one another about the gate.

7. A semiconductor device comprising:
    an SOI wafer including a semiconductor layer, a substrate and a buried insulator layer therebetween; the semiconductor layer including a source region, a drain region, and a body region disposed between the source and drain regions, at least one of the source and drain regions including an epitaxially raised region; and, a gate on the semiconductor layer, the gate being operatively arranged with the source, drain, and body regions to form a transistor;

wherein the at least one of the source and drain regions including the epitaxially raised region includes a silicide region spaced apart from the body region;

wherein the at least one of the source and drain regions including the epitaxially raised region has a dopant concentration which increases or is substantially uniform from a top surface of the at least one of the source and drain regions including the epitaxially raised region through the epitaxially raised region thereof.

8. A semiconductor device as set forth in claim 7, wherein the at least one of the source and drain regions including the epitaxially raised region interfaces with the body region to form an S/D junction, and has a concentration of dopants at or near the S/D junction equal to or greater than about $1 \times 10^{18}$ atoms/cm$^3$.

9. A semiconductor device as set forth in claim 7, wherein the at least one of the source and drain regions including the epitaxially raised region interfaces with the body region to form an S/D junction, and the body region has a concentration of the dopants at or near S/D junction between about $5 \times 10^{17}$ atoms/cm$^3$ and about $5 \times 10^{18}$ atoms/cm$^3$.

10. A semiconductor device as set forth in claim 7, wherein the dopant concentration is equal to or greater than about $1 \times 10^{21}$ atoms/cm$^3$.

11. A semiconductor device as set forth in claim 10, wherein the silicide region is in a portion of the at least one of the source and drain regions including the epitaxially raised region having the dopant concentration.

12. A semiconductor device as set forth in claim 7, wherein both the source region and drain region include respective epitaxially raised regions.

13. A semiconductor device as set forth in claim 12, wherein the epitaxially raised source and drain regions include respective source and drain silicide regions spaced apart from the body region by about 200 to about 1000 Angstroms.

14. A semiconductor device as set forth in claim 13, wherein the source silicide region and the drain silicide region are substantially symmetric with one another about the gate.

15. A semiconductor device comprising:

an SOI wafer including a semiconductor layer, a substrate and a buried insulator layer therebetween; the semiconductor layer including a source region, a drain region, and a body region disposed between the source and drain regions, at least one of the source and drain regions including an epitaxially raised region; and, a gate on the semiconductor layer, the gate being operatively arranged with the source, drain, and body regions to form a transistor;

wherein the at least one of the source and drain regions including the epitaxially raised region includes a silicide region spaced apart from the body region;

wherein a dopant concentration decreases below a surface from which the epitaxially raised region is epitaxially raised through the at least one of the source and drain regions including the epitaxially raised region.

16. A semiconductor device as set forth in claim 15, wherein the at least one of the source and drain regions including the epitaxially raised region interfaces with the body region to form an S/D junction, and has a concentration of dopants at or near the S/D junction equal to or greater than about $1 \times 10^{18}$ atoms/cm$^3$.

17. A semiconductor device as set forth in claim 15, wherein the at least one of the source and drain regions including the epitaxially raised region interfaces with the body region to form an S/D junction, and the body region has a concentration of the dopants at or near S/D junction between about $5 \times 10^{17}$ atoms/cm$^3$ and about $5 \times 10^{18}$ atoms/cm$^3$.

18. A semiconductor device as set forth in claim 15, wherein both the source region and drain region include respective epitaxially raised regions.

19. A semiconductor device as set forth in claim 18, wherein the epitaxially raised source and drain regions include respective source and drain silicide regions spaced apart from the body region by about 200 to about 1000 Angstroms.

20. A semiconductor device as set forth in claim 19, wherein the source silicide region and the drain silicide region are substantially symmetric with one another about the gate.

21. A semiconductor device comprising:

an SOI wafer including a semiconductor layer, a substrate and a buried insulator layer therebetween; the semiconductor layer including a source region, a drain region, and a body region disposed between the source and drain regions, at least one of the source and drain regions including an epitaxially raised region; and, a gate on the semiconductor layer, the gate being operatively arranged with the source, drain, and body regions to form a transistor;

wherein the at least one of the source and drain regions including the epitaxially raised region includes a silicide region spaced apart from the body region;

wherein the at least one of the source and drain regions including the epitaxially raised region has a dopant concentration which decreases from a top surface of the at least one of the source and drain regions including the epitaxially raised region through the epitaxially raised region thereof.

22. A semiconductor device as set forth in claim 21, wherein the at least one of the source and drain regions including the epitaxially raised region interfaces with the body region to form an S/D junction, and has a concentration of dopants at or near the S/D junction equal to or greater than about $1 \times 10^{18}$ atoms/cm$^3$.

23. A semiconductor device as set forth in claim 21, wherein the at least one of the source and drain regions including the epitaxially raised region interfaces with the body region to form an S/D junction, and the body region has a concentration of the dopants at or near S/D junction between about $5 \times 10^{17}$ atoms/cm$^3$ and about $5 \times 10^{18}$ atoms/cm$^3$.

24. A semiconductor device as set forth in claim 21, wherein the dopant concentration is equal to or less than about $1 \times 10^{21}$ atoms/cm$^3$.

25. A semiconductor device as set forth in claim 24, wherein the silicide region is in a portion of the at least one of the source and drain regions including the epitaxially raised region having the dopant concentration.

26. A semiconductor device as set forth in claim 21, wherein both the source region and drain region include respective epitaxially raised regions.

27. A semiconductor device as set forth in claim 26, wherein the epitaxially raised source and drain regions include respective source and drain silicide regions spaced apart from the body region by about 200 to about 1000 Angstroms.

28. A semiconductor device as set forth in claim 27, wherein the source silicide region and the drain silicide region are substantially symmetric with one another about the gate.

* * * * *